US011171466B2

(12) United States Patent
Heaton et al.

(10) Patent No.: US 11,171,466 B2
(45) Date of Patent: Nov. 9, 2021

(54) ON-CHIP WAVELENGTH LOCKER

(71) Applicant: Lumentum Operations LLC, Milpitas, CA (US)

(72) Inventors: John M. Heaton, Malvern (GB); Konstantin Petrovich Petrov, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 191 days.

(21) Appl. No.: 16/243,799

(22) Filed: Jan. 9, 2019

(65) Prior Publication Data

US 2019/0221995 A1 Jul. 18, 2019

Related U.S. Application Data

(60) Provisional application No. 62/618,969, filed on Jan. 18, 2018.

(51) Int. Cl.
| | |
|---|---|
| *H01S 5/026* | (2006.01) |
| *H01S 5/12* | (2021.01) |
| *H01S 5/125* | (2006.01) |
| *H01S 5/06* | (2006.01) |
| *H01S 5/0687* | (2006.01) |

(Continued)

(52) U.S. Cl.
CPC ............ *H01S 5/0268* (2013.01); *G02B 6/12* (2013.01); *H01S 5/0261* (2013.01); *H01S 5/0264* (2013.01); *H01S 5/0612* (2013.01); *H01S 5/0687* (2013.01); *H01S 5/124* (2013.01); *H01S 5/125* (2013.01); *H01S 5/1209* (2013.01); *H04B 10/07957* (2013.01); *H01S 5/02325* (2021.01)

(58) Field of Classification Search
CPC .... H01S 5/0268; H01S 5/0687; H01S 5/0264; H01S 5/125; H01S 5/0612; H01S 5/1209; H01S 5/0261; H01S 5/124; H01S 5/02325; H01S 5/20; G02B 6/12; G02B 6/12019; G02B 6/122; G02B 2006/1215; G02B 2006/1209; G02B 2006/12147; G02B 2006/12135; H04B 10/07957
See application file for complete search history.

(56) References Cited

U.S. PATENT DOCUMENTS

| | | | | |
|---|---|---|---|---|
| 10,103,809 B2 * | 10/2018 | Sugiyama | .......... | G02B 6/12009 |
| 2009/0041073 A1 * | 2/2009 | Matsui | ................ | H01S 5/06256 |
| | | | | 372/34 |

(Continued)

*Primary Examiner* — Xinning(Tom) Niu
(74) *Attorney, Agent, or Firm* — Harrity & Harrity, LLP

(57) ABSTRACT

An on-chip wavelength locker may include an optical waveguide splitter to split an input optical signal received from a laser. The on-chip wavelength locker may include a plurality of integrated periodic optical elements, each to receive a respective portion of the input optical signal after splitting of the input optical signal by the optical waveguide splitter, and provide, based on the respective portion of the input optical signal, a respective periodic output optical signal of a plurality of periodic output optical signals. Each periodic output optical signal, of the plurality of periodic output optical signals, may be phase shifted with respect to other periodic output optical signals of the plurality of periodic output optical signals. The on-chip wavelength locker may include a plurality of integrated photodiodes to receive the plurality of periodic output optical signals in association with wavelength locking the laser.

20 Claims, 13 Drawing Sheets

(51) Int. Cl.
*G02B 6/12* (2006.01)
*H04B 10/079* (2013.01)
*H01S 5/02325* (2021.01)

(56) References Cited

U.S. PATENT DOCUMENTS

| | | | | |
|---|---|---|---|---|
| 2012/0237154 A1* | 9/2012 | Jeong | ........................ | G02B 6/12 385/1 |
| 2014/0334775 A1* | 11/2014 | Konishi | .................... | G02B 6/28 385/24 |
| 2015/0085292 A1* | 3/2015 | Uesaka | ................. | G01J 9/0246 356/477 |

* cited by examiner

ON-CHIP WAVELENGTH LOCKER

RELATED APPLICATION

This application claims priority under 35 U.S.C. § 119 to U.S. Provisional Patent Application No. 62/618,969, filed on Jan. 18, 2018, the content of which is incorporated by reference herein in its entirety.

TECHNICAL FIELD

The present disclosure relates to an integrated (i.e., on-chip) optical waveguide device and, more particularly, to an integrated optical waveguide device that forms a set of phase-shifted periodic output optical signals for use in association with, for example, wavelength locking a laser.

BACKGROUND

A commercial laser (e.g., a telecommunications laser) may operate on a grid of discrete optical frequencies (i.e., channels) as regulated by the International Telecommunication Union (ITU). Locking a frequency of the laser to a given channel can be accomplished with the aid of an external frequency reference (herein referred to as a wavelength locker). One conventional wavelength locker includes a single etalon (e.g., a Fabry-Perot (FP) etalon) and a set of optical detectors. Such a device is herein referred to as a single etalon wavelength locker. In operation, the set of optical detectors measures reflection or transmission of the etalon (which is inherently periodic). The period of the etalon is referred to as the free spectral range (FSR), and is typically chosen to match channel spacing (e.g., 50 gigahertz (GHz) spacing), although integer-multiple or sub-multiple spacing can be used. The frequency of the laser can be determined and adjusted (as needed) such that the laser is operating at a given channel. However, reliable wavelength locking to an arbitrary wavelength is not possible with a single etalon wavelength locker since a spectrum of a given etalon has periodically spaced peaks and valleys. These peaks and valleys result in "dead" regions (i.e., regions of reduced sensitivity) in which wavelength locking may be unreliable or impossible.

Another conventional wavelength locker includes a pair of etalons and a set of optical detectors. Such a device is referred to as a dual etalon wavelength locker. A dual etalon wavelength locker addresses the issue of the spectrum of a given etalon having periodically spaced peaks and valleys. In the dual etalon wavelength locker, a spectrum of the second etalon is typically shifted from that of the first etalon by approximately one-quarter of the FSR. In operation of the dual etalon wavelength locker, one etalon is used when the desired frequency falls within a "dead" region of the spectrum of the other etalon, and vice versa. Thus, wavelength locking can be achieved for an arbitrary wavelength since there, in theory, are no "dead" regions associated with a dual etalon wavelength locker.

Another implementation of the conventional wavelength locker includes a conventional delay line interferometer (DLI). A conventional DLI can take the form of, for example, a Mach-Zehnder (MZ) interferometer, a Michelson interferometer, and/or the like. The conventional DLI can be built from discrete optical elements or can be an optical waveguide device. The conventional DLI receives an input optical signal and generates a pair of output optical signals using a set of beam splitters and a set of reflective optical elements. Optical power in each output optical signal depends on a difference in optical path length between "arms" of the conventional DLI and on a wavelength of the light. Here, since the difference in optical path length is known, wavelength locking may be performed based on the output optical signals. However, this conventional DLI has a similar issue as the single etalon wavelength locker, in that peaks and valleys in a spectrum of the conventional DLI result in "dead" regions which render arbitrary wavelength locking using the conventional DLI unreliable or impossible.

SUMMARY

According to some possible implementations, an on-chip wavelength locker may include: an optical waveguide splitter to split an input optical signal received from a laser; a plurality of integrated optical elements with periodic wavelength dependence (herein referred to as integrated periodic optical elements), each to: receive a respective portion of the input optical signal after splitting of the input optical signal by the optical waveguide splitter, and provide, based on the respective portion of the input optical signal, a respective periodic output optical signal of a plurality of periodic output optical signals, wherein each periodic output optical signal, of the plurality of periodic output optical signals, is phase shifted with respect to other periodic output optical signals of the plurality of periodic output optical signals; and a plurality of integrated photodiodes to receive the plurality of periodic output optical signals in association with wavelength locking the laser.

According to some possible implementations, an integrated optical waveguide device may include: an optical waveguide splitter to split an input optical signal; a plurality of integrated periodic optical elements, each to: receive a respective portion of the input optical signal after splitting of the input optical signal by the optical waveguide splitter, and provide, based on the respective portion of the input optical signal, a respective periodic output optical signal of a plurality of periodic output optical signals, wherein each periodic output optical signal, of the plurality of periodic output optical signals, is phase shifted with respect to other periodic output optical signals of the plurality of periodic output optical signals.

According to some possible implementations, an integrated optical device may include: an optical waveguide splitter to split an input optical signal, a plurality of integrated periodic optical elements, each to: receive a respective portion of the input optical signal after splitting of the input optical signal by the optical waveguide splitter, and provide, based on the respective portion of the input optical signal, a respective periodic output optical signal of a plurality of periodic output optical signals, wherein each periodic output optical signal, of the plurality of periodic output optical signals, is phase shifted with respect to other periodic output optical signals of the plurality of periodic output optical signals; and a plurality of photodiodes to receive the plurality of periodic output optical signals, wherein one of: the optical waveguide splitter includes a 1×2 multimode interference (MMI) coupler, the plurality of integrated periodic optical elements includes an N×N (N≥3) MMI coupler, and the plurality of photodiodes includes N photodiodes, or the optical waveguide splitter includes a 1×M (M≥2) waveguide splitter, the plurality of integrated periodic optical elements includes M integrated periodic optical elements, and the plurality of photodiodes includes M pairs of photodiodes, wherein one of the M integrated periodic optical elements includes a 2×2 waveguide coupler and a mirror structure, and wherein one of the M pairs of photodiodes includes a reflection-sensing photodiode and a transmission-sensing photodiode.

DETAILED DESCRIPTION

Figure 1:
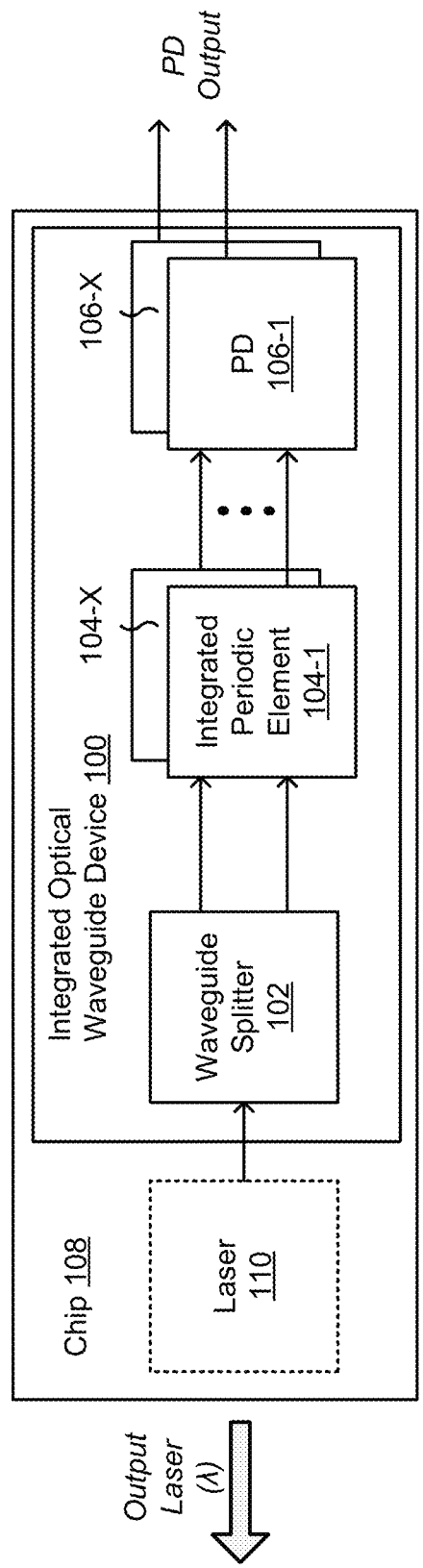
FIG. 1 is a diagram of an example integrated optical waveguide device described herein.

The following detailed description of example implementations refers to the accompanying drawings. The same reference numbers in different drawings may identify the same or similar elements.

As described above, a conventional etalon-based wavelength locker includes one or two etalons. However, an etalon is a bulk optical element and an etalon-based wavelength locker, regardless of whether it includes one or two etalons, includes other discrete optical elements (e.g., one or more beam splitters, one or more lenses, and/or the like). These discrete optical elements can be miniaturized in order to conserve as much space as possible but, in principle, an etalon-based wavelength locker is a free-space discrete optical system. Thus, as is the case for any free-space discrete optical system, assembly is performed piece-by-piece using pick-and-place machinery and a combination of passive and active optical alignment. The discrete optical elements are typically secured in place with epoxy or solder. In addition to this slow, complex, and capital-equipment-heavy assembly process that is required to build such a device, the etalon-based wavelength locker has several drawbacks.

One drawback of the etalon-based wavelength locker is that a size of the etalon(s) may be undesirably large as compared to a size of the laser for which wavelength locking is to be performed. For example, a 50 GHz silica etalon has a length of approximately 2 millimeters (mm), whereas a length of the laser may be in the sub-millimeter (i.e., less than 1 mm) range. As a result, an amount of space needed for the etalon-based wavelength locker may be undesirable or infeasible, particularly in an application with strict spatial limitations. Another drawback of the etalon-based wavelength locker is that a height mismatch between the etalon-based wavelength locker and the laser may require hybrid integration, thereby adding additional time, cost, and complexity to the building process.

Still another drawback of the etalon-based wavelength locker is that an optical path is sensitive to vibration, which affects operation of the locking loop, thereby degrading performance. Similarly, the optical path of the etalon-based wavelength locker is sensitive to dust and condensation, which may require hermetic sealing, thereby adding time, cost, complexity to the building process, as well as increasing size. Yet another drawback of the etalon-based wavelength locker is that tradeoffs of hybrid integration typically require that the etalon-based wavelength locker is in front of the laser (i.e., in front of the output of the laser), which makes the etalon-based wavelength locker vulnerable to optical feedback.

Additionally, typical requirements for operation of any wavelength locker include stability of temperature and mechanical stress, if any. Specifications on laser frequency drift, typically below 1 GHz, make it necessary to actively stabilize a temperature of the conventional wavelength locker even when one or more elements of the conventional wavelength locker (e.g., an etalon) are made from a relatively temperature-insensitive material, such as fused silica or low-expansion glass. In addition to active temperature control, thermal shields need to be constructed to isolate the conventional wavelength locker from a loading effect of walls of an optical package of the conventional wavelength locker. However, this still leaves open the possibility of drift from relaxation of mechanical stress created during the assembly process.

Further, a conventional wavelength locker can include a conventional DLI. However, as noted above, the conventional DLI has a similar issue as the single etalon wavelength locker in that peaks and valleys in a spectrum of the DLI result in "dead" regions (i.e., regions of reduced sensitivity) which render arbitrary wavelength locking to be unreliable or impossible. Additionally, when formed using discrete optical elements, the conventional DLI suffers issues similar to those described above in association with etalon-based wavelength lockers (e.g., an undesirably large size, sensitivity to vibration, sensitivity to dust and condensation, hybrid integration issues, and/or the like).

Some implementations described herein provide an integrated optical waveguide device that provides, based on an input optical signal, a plurality of periodic output optical signals, each of which is phase shifted with respect to other periodic output optical signals of the plurality of periodic output optical signals. In some implementations, the integrated optical waveguide device can include an optical waveguide splitter and a plurality of integrated periodic optical elements (e.g., a multimode interference (MMI) coupler, groups of elements each including a waveguide coupler and a mirror structure) that provide the plurality of periodic output optical signals. The plurality of periodic output optical signals can be used in association with, for example, wavelength locking a laser.

In some implementations, the integrated optical waveguide device can be on a same chip as the laser for which wavelength locking is to be performed. The integrated optical waveguide device described herein may be a monolithically integrated, compact, multi-phase optical device that can be used as a wavelength locker. In some implementations, the integrated optical waveguide device may be used to wavelength lock a laser to an arbitrary optical frequency within a wide band and, in such a case, may be fabricated together with the laser (e.g., a semiconductor laser) on a single chip.

The integrated optical waveguide device described herein addresses the above described issues associated with conventional wavelength lockers (e.g., a single etalon wavelength locker, a dual etalon wavelength locker, a wavelength locking including a conventional DLI). More specifically, by providing multiple periodic output optical signals, a spectrum of the integrated optical waveguide device does not include "dead" regions (e.g., as in the case of a single etalon wavelength locker or a wavelength locking including a conventional DLI). As a result, arbitrary wavelength locking is possible with the integrated optical waveguide device. In other words, wavelength locking to any frequency within a wide band is possible (i.e., there are no discrete channel limits).

Further, the integrated optical waveguide device does not include discrete optical elements and, therefore, can be smaller in size and comparatively easier to manufacture (e.g., as compared to a wavelength locker including discrete optical elements). Moreover, since the integrated optical waveguide device does not include discrete optical elements, the integrated optical waveguide device has a reduced sensitivity to vibration, and a reduced sensitivity to dust and condensation.

Additionally, the integrated optical waveguide device described herein does not suffer from hybrid integration issues (e.g., as in the case of conventional wavelength lockers that use discrete optical components) and, therefore, need not be placed in front of the laser output. As a result, locker sensitivity to external feedback is reduced and forward output of the laser is not tapped or otherwise obstructed.

FIG. 1 is a diagram of an example integrated optical waveguide device 100 described herein. As shown in FIG. 1, integrated optical waveguide device 100 may include a waveguide splitter 102, a group of integrated periodic optical elements 104 (e.g., integrated periodic optical element 104-1 through integrated periodic optical element 104-X (X≥2)), and a group of photodiodes (PDs) 106 (e.g., PD 106-1 through PD 106-X). As shown in FIG. 1, integrated optical waveguide device 100 may be formed on a chip 108. In some implementations, as illustrated in FIG. 1, a laser 110 may also be formed on chip 108. For example, when integrated optical waveguide device 100 is to be used for wavelength locking laser 110, integrated optical waveguide device 100 may be integrated on a same chip 108 as laser 110.

Waveguide splitter 102 includes an optical waveguide to split an input optical signal received at integrated optical waveguide device 100. For example, when integrated optical waveguide device 100 is to be used in association with wavelength locking laser 110, waveguide splitter 102 may be arranged to split an input optical signal received from laser 110 (e.g., from a back side of laser 110, as indicated in FIG. 1). In some implementations, waveguide splitter 102 may include a 1×2 multimode interference (MMI) coupler. In some implementations, waveguide splitter 102 may include a 1×M (M≥2) waveguide splitter.

An integrated periodic optical element 104 includes one or more optical elements to receive a portion of the input optical signal (after splitting by waveguide splitter 102) and provide, based on the portion of the input optical signal, a periodic output optical signal. Here, each integrated periodic optical element 104 of integrated optical waveguide device 100 receives a respective portion of the input optical signal, and provides a respective periodic output optical signal (e.g., such that a group of periodic output optical signals are generated from the input optical signal). In some implementations, integrated periodic optical elements 104 of integrated optical waveguide device 100 generate the group of periodic output optical signals such that each periodic output optical signal, of the group of periodic output optical signals, is phase shifted with respect to other periodic output optical signals, as illustrated in further detail below.

In some implementations, such as when waveguide splitter 102 includes a 1×2 MMI coupler, the group of integrated periodic optical elements 104 includes an N×N (N≥2) MMI coupler. In some implementations, such as when waveguide splitter 102 includes a 1×M waveguide splitter, the group of integrated periodic optical elements 104 includes M integrated periodic optical elements 104, each of which includes a waveguide coupler (e.g., a 2×2 waveguide coupler) and a mirror structure (e.g., a structure including one or more reflective optical elements), as described in further detail below.

PD 106 includes a photodiode to receive a periodic output optical signal and convert the periodic output optical signal to an output electrical signal (e.g., a current signal). In some implementations, a group of output electrical signals generated by PDs 106 may be used in association with wavelength locking laser 110. In some implementations, such as when waveguide splitter 102 includes a 1×2 MMI coupler and the group of integrated periodic optical elements 104 includes an N×N MMI coupler, the group of PDs 106 includes N PDs 106. In some implementations, such as when waveguide splitter 102 includes a 1×M waveguide splitter, the group of integrated periodic optical elements 104 includes M integrated periodic optical elements 104, the group of PDs 106 includes M pairs of PDs 106 (i.e., the group of PDs 106 includes 2M PDs 106). In such a case, each of the M pairs of PDs 106 may include a PD 106 arranged as a reflection-sensing photodiode and a PD 106 arranged as a transmission-sensing photodiode.

In some implementations, as shown in FIG. 1, PDs 106 can be integrated in integrated optical waveguide device 100 (e.g., PDs 106 can be integrated in integrated optical waveguide device 100 on chip 108). Alternatively, in some implementations, PDs 106 can be separate from integrated optical waveguide device 100 (e.g., such that PDs 106 are including a different optical structure and/or are not integrated on chip 108). In other words, integration of PDs 106 on chip 108 is optional.

In some implementations, as described above, integrated optical waveguide device 100 can be included in a wavelength locker associated with performing wavelength locking of laser 110. In some implementations, integrated optical waveguide device 100 and laser 110 may be integrated on a single chip 108, as described above. In such a case, integrated optical waveguide device 100 can be referred to as an on-chip wavelength locker. As further shown, in some implementations integrated optical waveguide device 100 may be formed such that an input optical signal is provided to integrated optical waveguide device 100 from a back side of laser 110 (e.g., from a side of laser 110 that is opposite to a side of laser 110 from which an output laser is provided). Such an arrangement reduces optical feedback to integrated optical waveguide device 100 (e.g., as compared to positioning integrated optical waveguide device 100 in front of the output laser), which increases laser output power, reliability and operational lifetime of the device, and eliminates obstruction of the laser output by integrated optical waveguide device 100.

In some implementations, integrated optical waveguide device 100 can be included in another type of optical device, such as a coherent receiver or another optical device for which periodic output optical signals are desired.

Notably, by providing multiple periodic output optical signals, integrated optical waveguide device 100 does not include "dead" regions (e.g., as in the case of a single etalon wavelength locker or a wavelength locking including a conventional DLI). As a result, arbitrary wavelength locking may be achieved with integrated optical waveguide device 100. Moreover, integrated optical waveguide device 100 does not include discrete optical elements and, therefore, can be smaller in size and comparatively easier to manufacture (e.g., as compared to a wavelength locker including discrete optical elements), and has a reduced size, a reduced sensitivity to vibration, a reduced sensitivity to dust and condensation, and does not suffer from hybrid integration issues as in the case of some conventional wavelength lockers.

As indicated above, FIG. 1 and its description herein are provided merely as one or more examples. Other examples may differ from what is described with regard to FIG. 1.

FIGS. 2A-2C, 3A-3B, and 4A-4D are diagrams of example integrated optical waveguide devices 100 including waveguide splitter 102 in the form of a 1×2 MMI coupler and integrated periodic optical elements 104 in the form of an N×N MMI coupler. In the example implementations shown in FIGS. 2A, 2C, 3A, 4A, and 4C, MMI 202 is a 1×2 MMI coupler and corresponds to waveguide splitter 102, MMI 204 is an N×N MMI coupler and corresponds to integrated periodic optical elements 104, and PDs 206 correspond to PDs 106.

An MMI coupler (e.g., MMI 202, MMI 204) is an optical element comprising a multimode optical waveguide. In the MMI coupler, a set of input ports are on a first surface (e.g., a first end) of the multimode optical waveguide, and a set of output ports are on a second surface (e.g., a second (opposite) end) of the multimode optical waveguide. The MMI coupler allows one or more input signals to be split, combined, and/or modified such that one or more output optical signals are provided at the output ports of the MMI coupler. In operation, the MMI coupler exploits the phenomenon of self-imaging—that within an MMI waveguide, an input electric field of the light is reproduced in single or multiple images at certain periodic intervals along a length of the MMI coupler (i.e., along a direction of propagation of the light). As a result, a length of MMI 202 can be selected such that an input optical signal is split into two portions at output ports of MMI 202. Similarly, a length of MMI 204 can be selected such that the first and second portions of the input optical signal, after propagating through MMI 204, provide N periodic output optical signals at output ports of MMI 204. In some implementations, a length of MMI 202 and/or MMI 204 may be in a range from approximately 50 microns to approximately 500 microns, such as 150 microns. In some implementations, a width (e.g., a channel width) of MMI 202 and/or MMI 204 may be in a range from approximately 2 microns to approximately 12 microns, such as 5 microns.

Figure 2A:
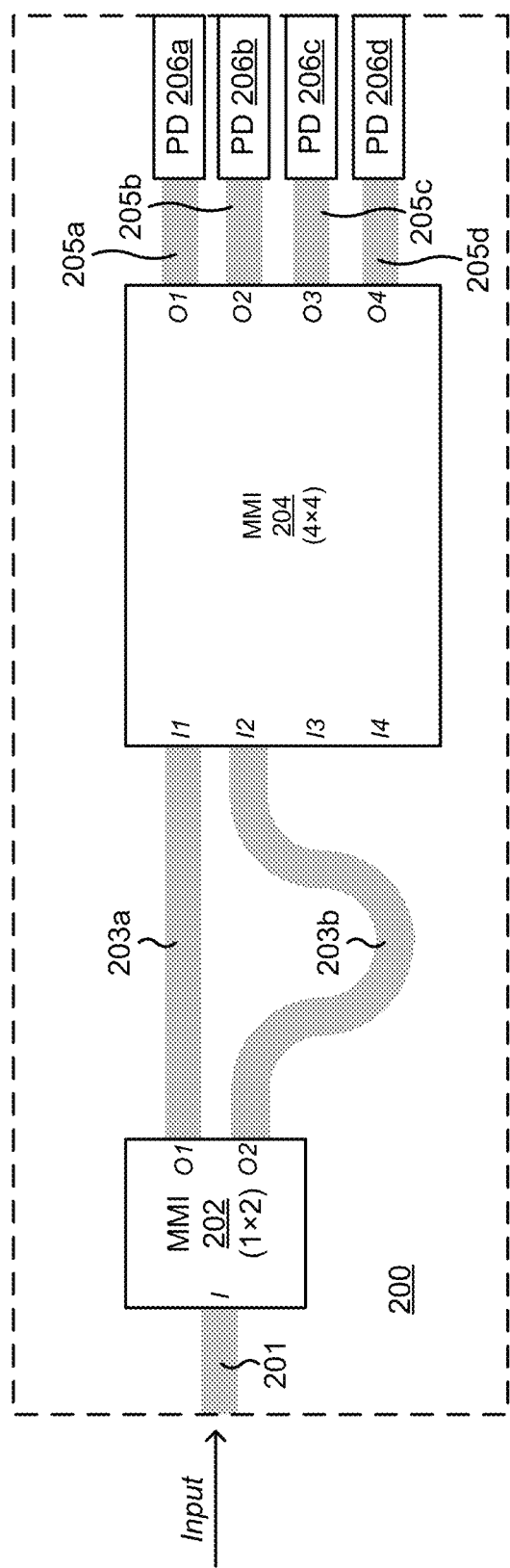
FIGS. 2A-2C, 3A-3B, and 4A-4D are diagrams of example integrated optical waveguide devices including a waveguide splitter in the form of a 1×2 MMI coupler and integrated periodic optical elements in the form of an N×N (N≥1) multimode interference (MMI) coupler.
Figure 2B:
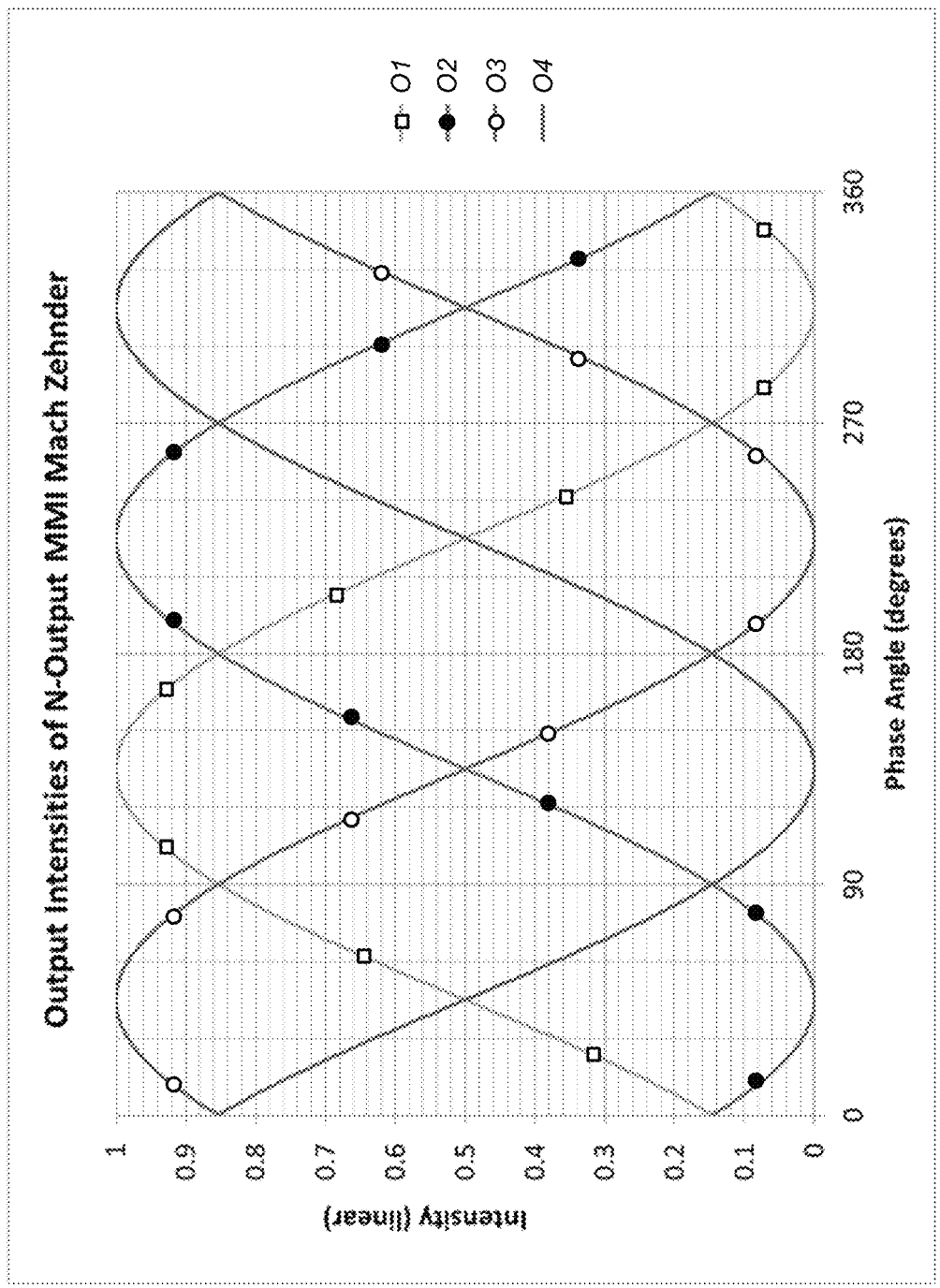
Figure 2C:
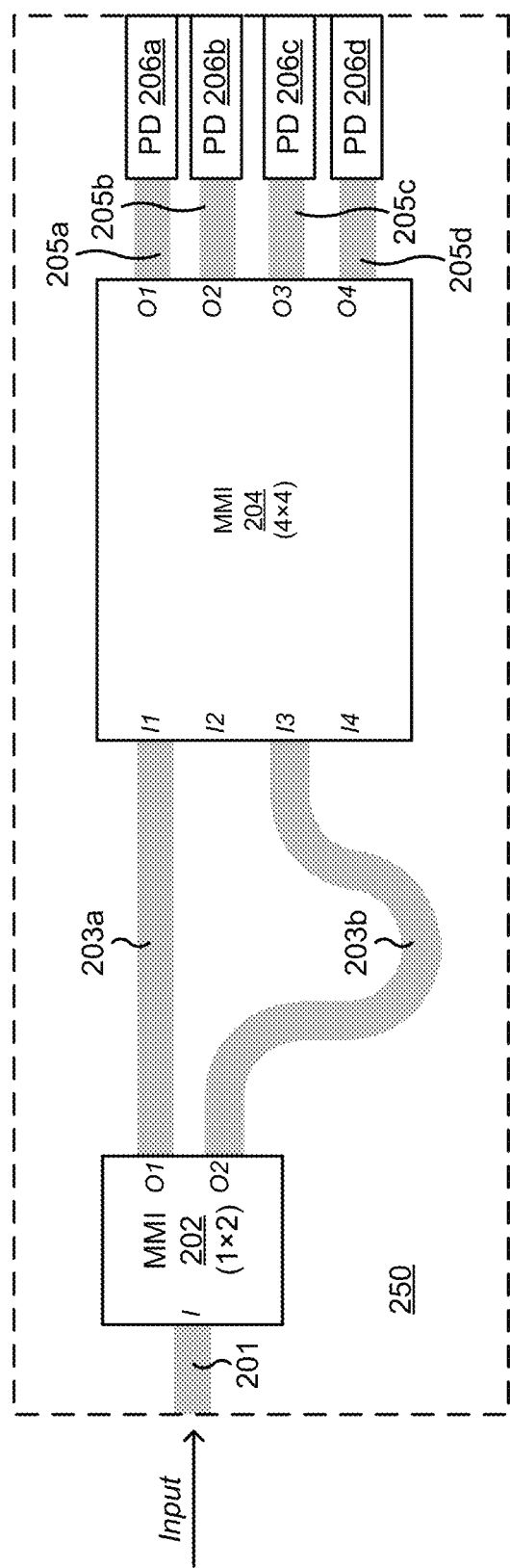

FIGS. 2A-2C are diagrams associated with integrated optical waveguide devices 100 in which MMI 204 is a 4×4 MMI coupler (N=4). FIG. 2A is a diagram of an example implementation 200 of integrated optical waveguide device 100 (herein referred to as integrated optical waveguide device 200). As shown in FIG. 2A, in integrated optical waveguide device 200, an input port I of MMI 202 is arranged to receive, via waveguide 201, an input optical signal from an input source (e.g., a back side of laser 110).

As further shown, output port O1 of MMI 202 is coupled to input port I1 of MMI coupler 204 via waveguide 203a (e.g., a straight waveguide), and output port O2 of MMI 202 is coupled to input port I2 of MMI 204 via waveguide 203b (e.g., a delay line waveguide). As shown, waveguide 203b is formed such that a length of waveguide 203b is greater than a length of waveguide 203a. This difference in length provides a wavelength dependent phase difference between portions of the input optical signals at ports I1 and I2 of MMI 204. Here, the difference in length may be selected such that a phase difference between each periodic optical output signal is approximately 360/N degrees. As indicated in FIG. 2A, input ports I3 and I4 are not used in integrated optical waveguide device 200. In other words, in integrated optical waveguide device 200, MMI 204 is a 4×4 MMI, but only two input ports are used.

Notably, input port I2 of MMI 204 (i.e., the input port of MMI 204 to which output port O2 of MMI 202 is coupled) is not a symmetrically equivalent port to input port I1 of MMI 204 (i.e., the input port of MMI 204 to which output port O1 of MMI 202 is coupled). This asymmetrical coupling is needed in order to cause MMI 204 to provide a group of phase-shifted periodic output optical signals that can be used for wavelength locking laser 110, coherent receiving, and/or the like, as described herein. Put generally, if waveguide 203a guides light into input port i of an N×N MMI 204 and waveguide 203b guides light into input port j of N×N MMI 204, then j should not equal N+1−i (e.g., j≠N+1−i). As an example, in integrated optical waveguide device 200, since port O1 of MMI 202 is coupled to port I1 of MMI 204 (i=1), then port O2 of MMI cannot be coupled to port I4 of MMI 204 (j≠4) (e.g., since N+1−i 4+1−1=4). As another example, in a case where port O1 of MMI 202 is coupled to port I2 of MMI 204 (i=2), then port O2 of MMI cannot be coupled to port I3 of MMI 204 (j≠3) (e.g., since N+1−i 4+1−2=3).

As further shown in FIG. 2A, each output port of MMI 204 may be coupled to a PD 206 via a respective waveguide 205 (e.g., port O1 of MMI 204 is coupled to PD 206a via waveguide 205a, port O2 of MMI 204 is coupled to PD 206b via waveguide 205b, port O3 of MMI 204 is coupled to PD 206c via waveguide 205c, and port O4 of MMI 204 is coupled to PD 206d via waveguide 205d).

In operation, an input optical signal is received, via waveguide 201, at input port I1 of MMI 202. Here, MMI 202 splits the input optical signal into a first portion and a second portion at port O1 and port O2 of MMI 202, respectively. The first portion of the input optical signal is guided to port I1 of MMI 204 via waveguide 203a (e.g., a straight waveguide). The second portion of the input optical signal is guided to port I2 of MMI 204 via waveguide 203b (e.g., a delay line waveguide). As described above, the difference in length between waveguide 203a and waveguide 203b provides a wavelength dependent phase difference between the first and second portions of the input optical signal at ports I1 and I2 of MMI 204. Here, the first and second portions of the input optical signal propagate through MMI 204 and, in the case of integrated optical waveguide device 200, MMI 204 generates a periodic output optical signal at each of the four output ports of MMI 204. Here, intensity at each of port O1, O2, O3, and O4 of MMI 204 depends on the phase difference between the first and second portions of the input optical signal at ports I1 and I2 of MMI 204. In integrated optical waveguide device 200, a periodic output optical signal provided at a given output port of MMI 204 has a 90 degree phase difference (e.g., 360/N=360/4=90) from a periodic optical output signal provided at an adjacent port output port of MMI 204. Each of the four periodic optical output signals propagates to a respective PD 206, which converts the light to an electrical signal that can be used, for example, in association with wavelength locking laser 110 (e.g., using techniques known in the art).

FIG. 2B is a graphical representation of intensities at output ports of MMI 204 for a range of phase angles from 0 to 360 degrees. In FIG. 2B, the phase angle corresponds to the phase difference between the first and second portions of the input optical signal at ports I1 and I2 of MMI 204. Since this phase difference is wavelength dependent, as described above, a given phase angle is therefore representative of a particular wavelength.

As shown in FIG. 2B, a given phase angle (and therefore a given wavelength) can be described by a set of four intensity values, each associated with a given output port of MMI 204. Thus, a wavelength of the input optical signal can be determined based on a set of intensity values (e.g., which can be identified from output signals provided by PDs 206). As an example, a band from 1530 nanometers (nm) to 1570 nm may occupy the horizontal axis of FIG. 2B (e.g., where 1530 nm corresponds to a 0 (zero) degree phase angle, and 1570 nm corresponds to a 360 degree phase angle). Here, any arbitrary wavelength in this 40 nm band can be determined based on a set of intensity values. Notably, at any wavelength, there is at least one signal that has a slope (i.e., is not at a peak or a valley), thereby avoiding unreliability issues resulting from "dead" regions, as in the case of single etalon wavelength lockers and wavelength lockers including a conventional DLI.

FIG. 2C is a diagram of an example implementation 250 of integrated optical waveguide device 100 (herein referred to as integrated optical waveguide device 250). Integrated optical waveguide device 250 is similar to integrated optical waveguide device 200, except that port O2 of MMI 202 is coupled to port I3 of MMI 204 (rather than port I2 of MMI 204) via waveguide 203b. Here, port I3 of MMI 204 is not a symmetrically equivalent port to port I1 of MMI 204 (e.g., port I4 of MMI 204 is the symmetrically equivalent port to port I1 of MMI 204, as described above).

In operation, integrated optical waveguide device 250 operates in a similar manner to integrated optical waveguide device 200. In the case of integrated optical waveguide device 250, intensity curves of the periodic output optical signals are phase shifted as compared to those shown in FIG. 2B (e.g., due to port O2 of MMI 202 being coupled to port I3 of MMI 204), but the principles described in association with FIG. 2B remain applicable.

Figure 3A:
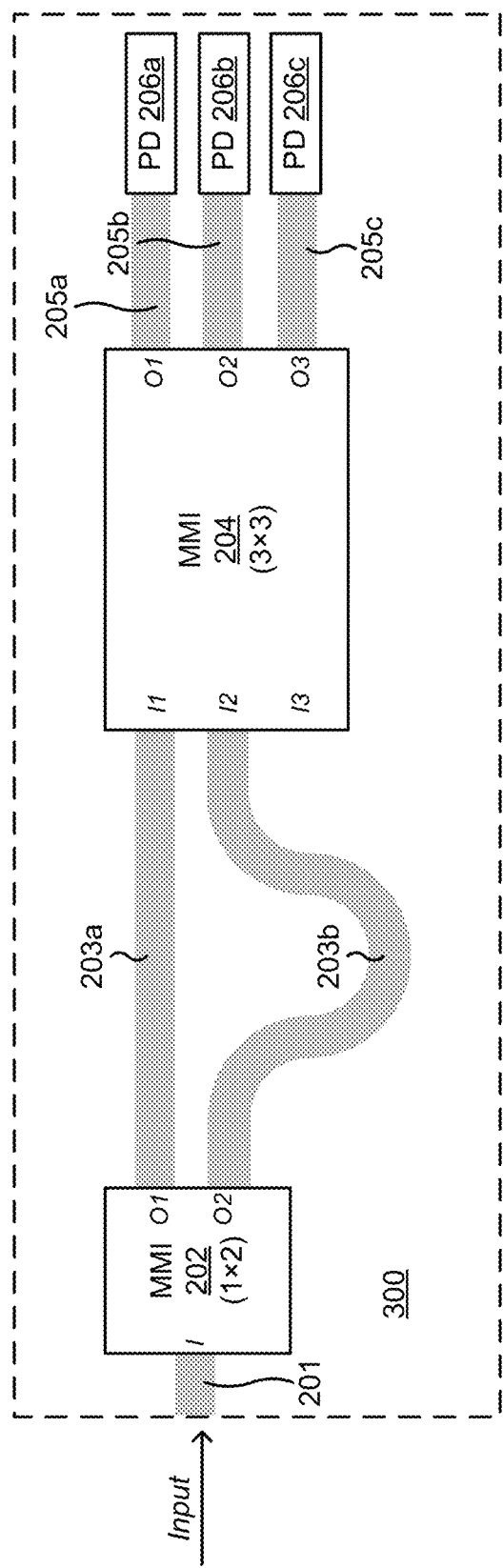
Figure 3B:
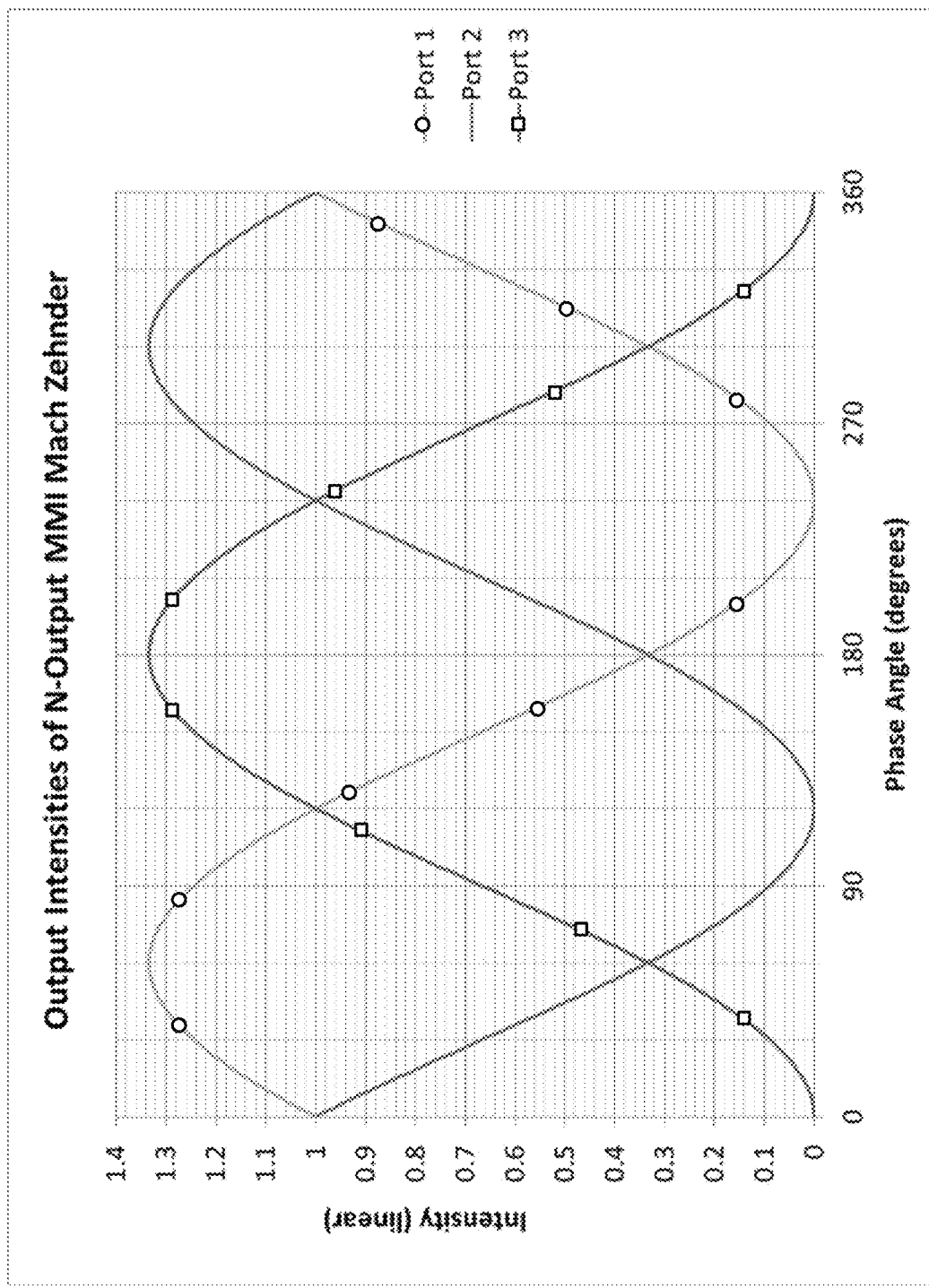

FIGS. 3A and 3B are diagrams associated with integrated optical waveguide devices 100 in which MMI 204 is a 3×3 MMI coupler (N=3). FIG. 3A is a diagram of an example implementation 300 of integrated optical waveguide device 100 (herein referred to as integrated optical waveguide device 300). Integrated optical waveguide device 300 is similar to integrated optical waveguide device 200, except that MMI 204 is a 3×3 MMI coupler (rather than a 4×4 MMI coupler). In integrated optical waveguide device 300 port I2 of MMI 204 is not a symmetrically equivalent port to port I1 of MMI 204. Rather, in integrated optical waveguide device 300, since MMI 204 is a 3×3 MMI coupler, port I3 of MMI 204 is the symmetrically equivalent port to port I1 of MMI 204.

In operation, integrated optical waveguide device 300 operates in a similar manner to integrated optical waveguide device 200. However, in integrated optical waveguide device 300, a periodic output optical signal provided at a given output port of MMI 204 has a 120 degree phase difference (e.g., 360/N=360/3=120) from a periodic optical output signal provided at adjacent output port of MMI 204. The three periodic optical output signals are provided to corresponding PDs 206, and output electrical signals of PDs 206 can be used, for example, in association with wavelength locking laser 110.

FIG. 3B is a graphical representation of intensities at output ports of MMI 204 for a range of phase angles from 0 to 360 degrees. Here, a wavelength of the input optical signal can be determined in a manner similar to that described above in association with FIG. 2B. In other words, the principles described above in association with FIG. 2B are applicable to FIG. 3B. Once again, at any wavelength in the band, there is at least one periodic output optical signal that has a slope (i.e., is not at a peak or a valley), thereby avoiding unreliability issues resulting from "dead" regions.

Figure 4A:
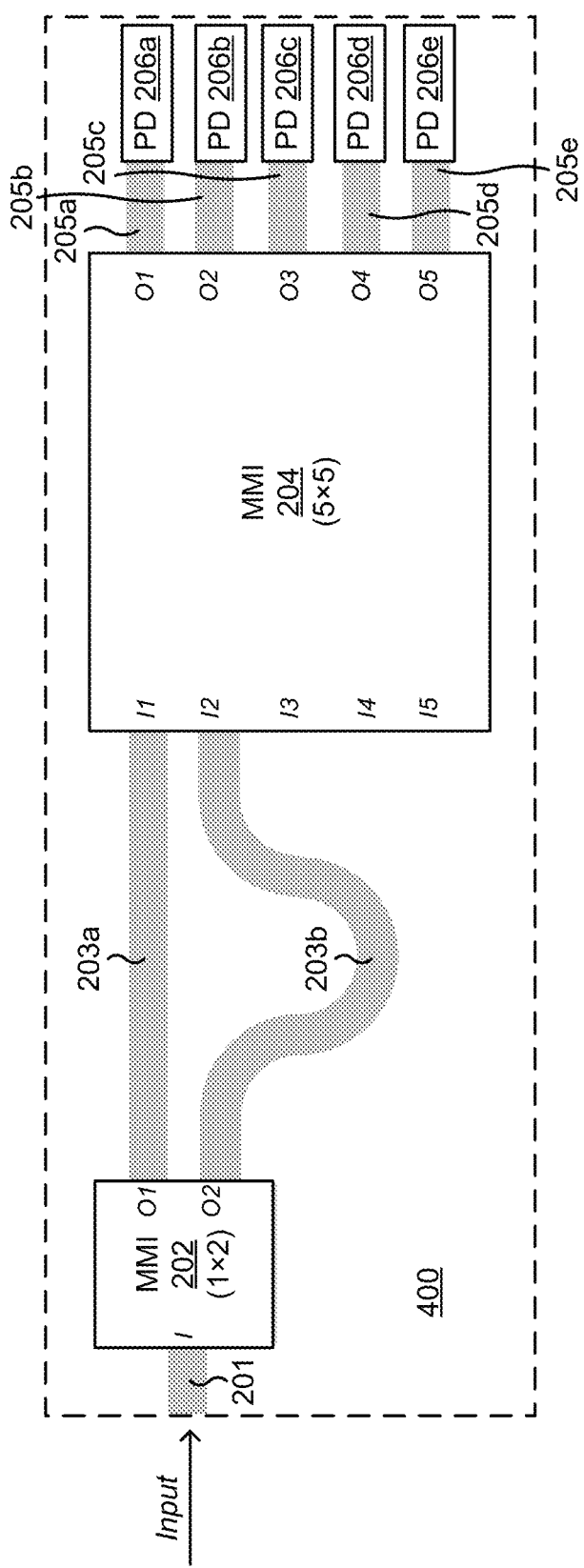

FIGS. 4A-4D are diagrams of integrated optical waveguide devices 100 in which MMI 204 is a 5×5 MMI coupler (N=5). FIG. 4A is a diagram of an example implementation 400 of integrated optical waveguide device 100 (herein referred to as integrated optical waveguide device 400). Integrated optical waveguide device 400 is similar to integrated optical waveguide device 200, except that MMI 204 is a 5×5 MMI coupler (rather than a 4×4 MMI coupler). In integrated optical waveguide device 400, port I2 of MMI 204 is not a symmetrically equivalent port to port I1 of MMI 204. Rather, in the case of a 5×5 MMI 204, port I5 of MMI 204 is the symmetrically equivalent port to port I1 of MMI 204.

In operation, integrated optical waveguide device 400 operates in a similar manner to integrated optical waveguide device 200. However, in integrated optical waveguide device 400, a periodic output optical signal provided at a given output port of MMI 204 has a 72 degree phase difference (e.g., 360/N=360/5=72) from a periodic optical output signal provided at an adjacent output port of MMI 204. The five periodic optical output signals are provided to corresponding PDs 206, and output electrical signals of PDs 206 can be used, for example, in association with wavelength locking laser 110.

Figure 4B:
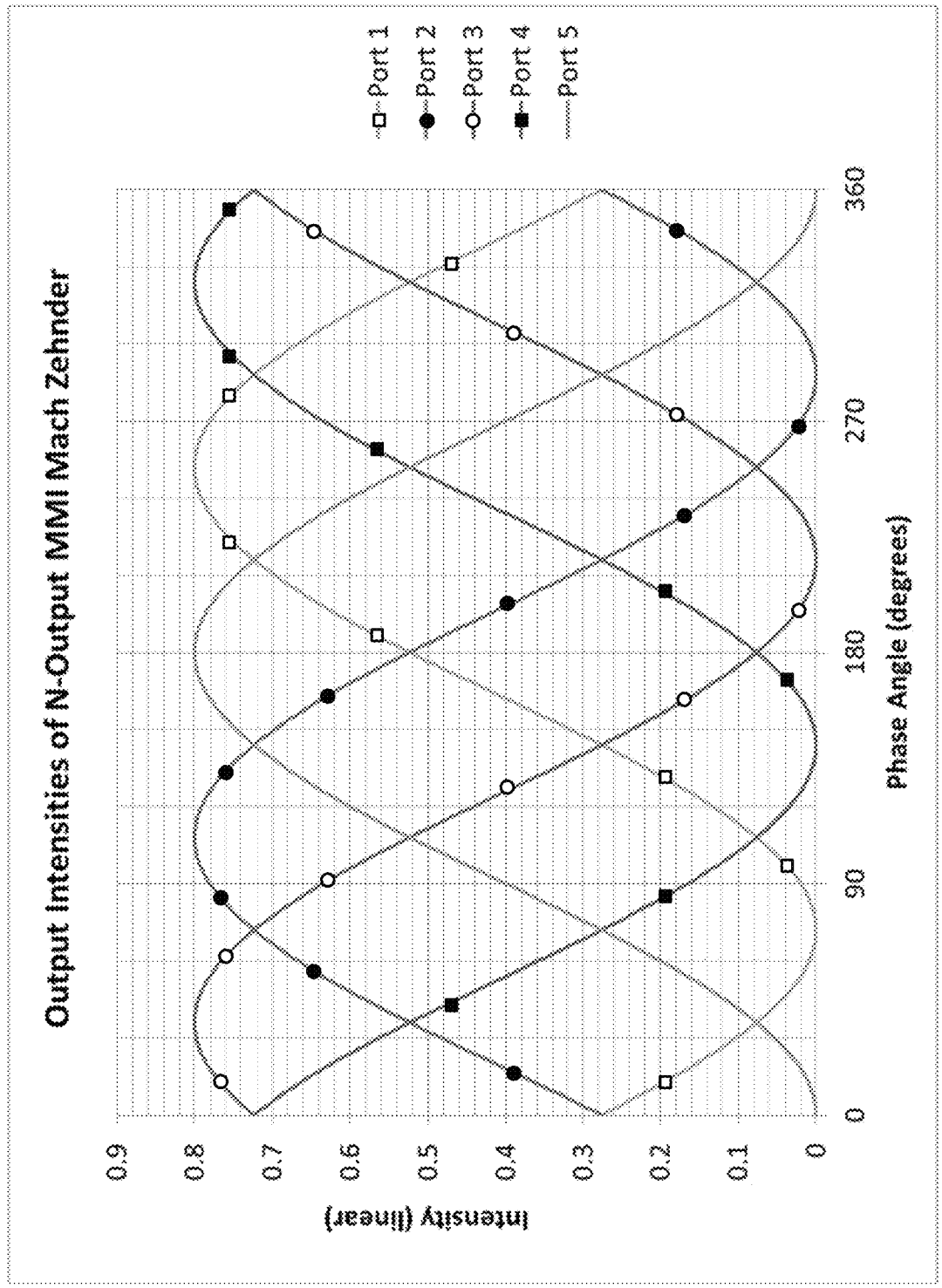

FIG. 4B is a graphical representation of intensities at output ports of MMI 204 of integrated optical waveguide device 400 for a range of phase angles from 0 to 360 degrees. Here, a wavelength of the input optical signal can be determined in a manner similar to that described above in association with FIG. 2B. In other words, the principles described above in association with FIG. 2B are applicable to FIG. 4B. Once again, at any wavelength in the band, there is at least one periodic output optical signal that has a slope (i.e., is not at a peak or a valley), thereby avoiding unreliability issues resulting from "dead" regions. In some implementations, using a 5×5 MMI coupler provides redundancy, thereby increasing reliability of integrated optical waveguide device 400 (e.g., in the event that a PD 206 fails, experiences and error, and/or the like).

Figure 4C:
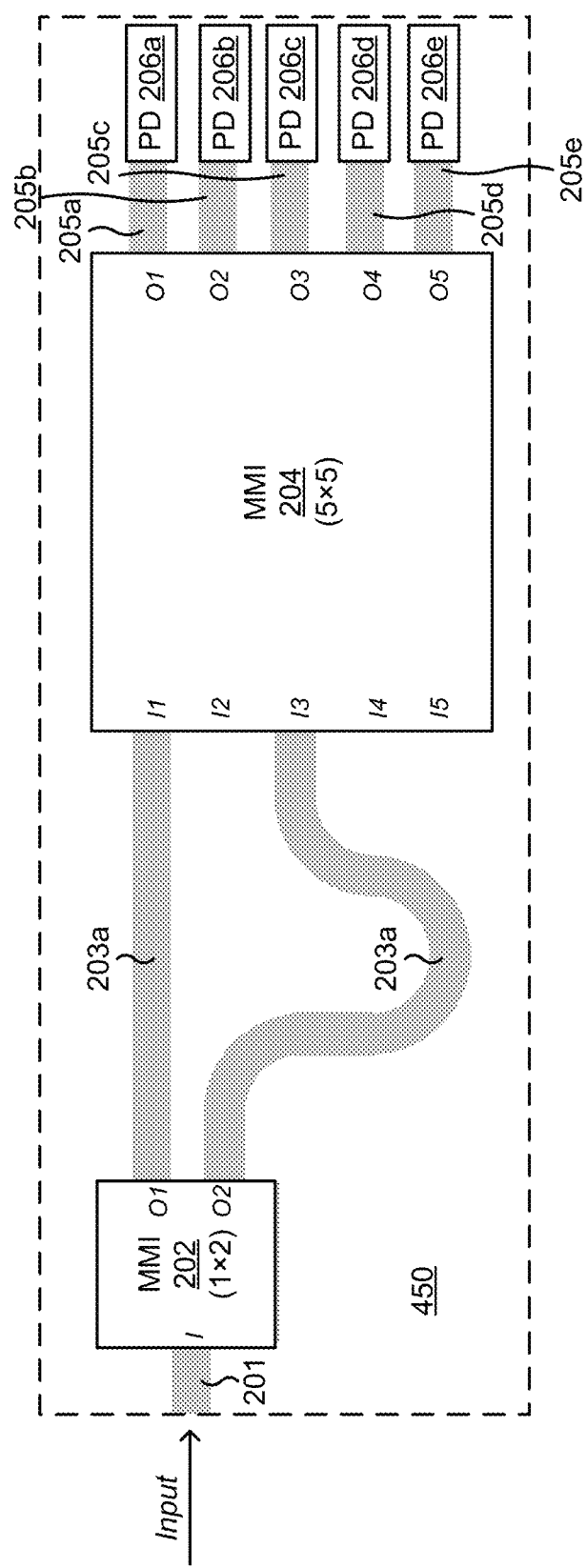

FIG. 4C is a diagram of an example implementation 450 of integrated optical waveguide device 100 (herein referred to as integrated optical waveguide device 450). Integrated optical waveguide device 450 is similar to integrated optical waveguide device 400, except that port O2 of MMI 202 is coupled to port I3 of MMI 204 (rather than port I2 of MMI 204) via waveguide 203b. Here, port I3 of MMI 204 is not a symmetrically equivalent port to port I1 of MMI 204 (e.g., port I5 of MMI 204 is the symmetrically equivalent port to port I1 of MMI 204, as described above).

In operation, integrated optical waveguide device 450 operates in a similar manner to integrated optical waveguide device 400.

Figure 4D:
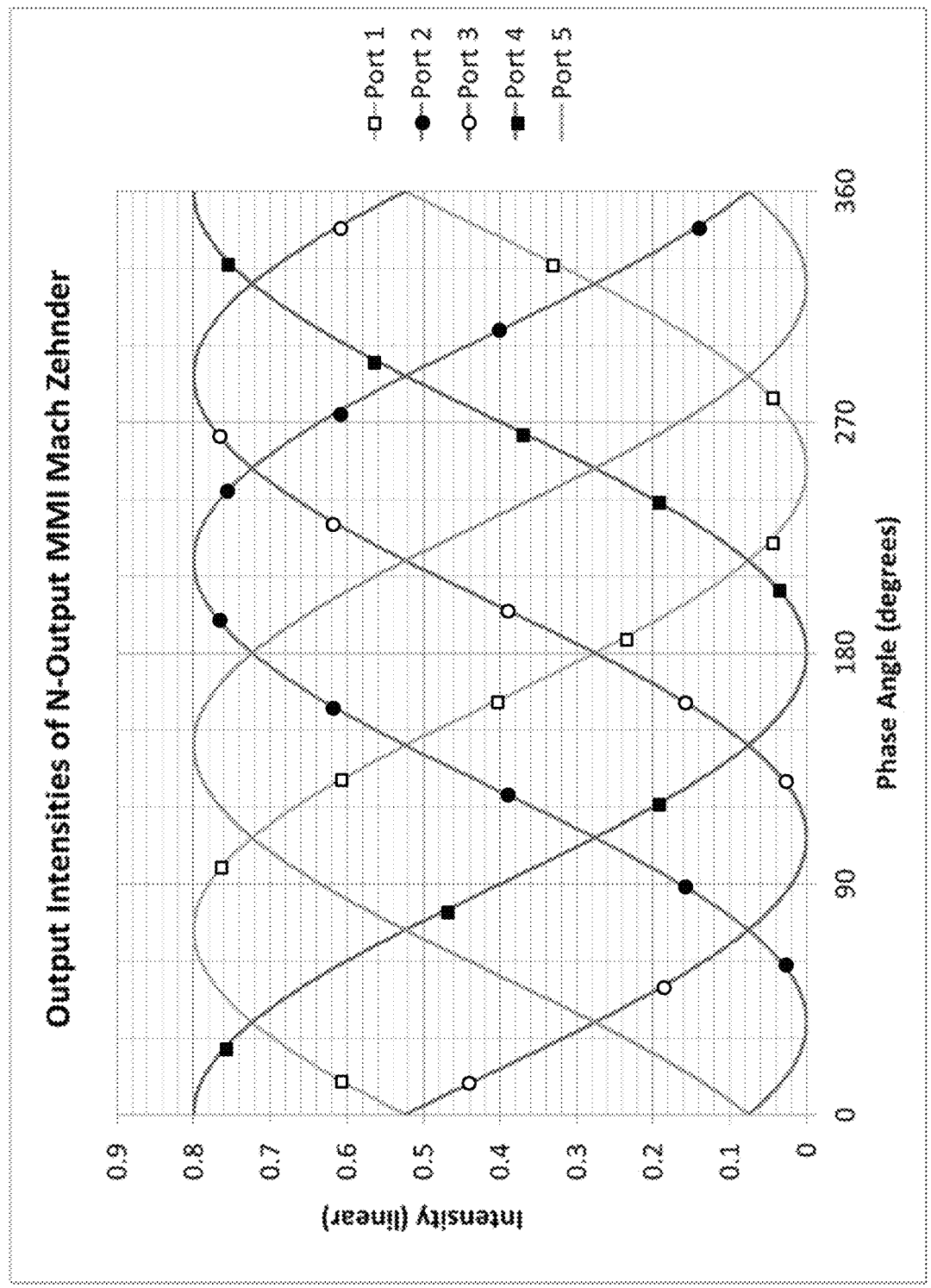

FIG. 4D is a graphical representation of intensities at output ports of MMI 204 of integrated optical waveguide device 450 for a range of phase angles from 0 to 360 degrees. Here, a wavelength of the input optical signal can be determined in a manner similar to that described above in association with FIG. 2B. In other words, the principles described above in association with FIG. 2B are applicable to FIG. 4D. Once again, at any wavelength in the band, there is at least one periodic output optical signal that has a slope (i.e., is not at a peak or a valley), thereby avoiding unreliability issues resulting from "dead" regions. In some implementations, using a 5×5 MMI coupler provides redundancy, thereby increasing reliability of integrated optical waveguide device 400 (e.g., in the event that a PD 206 fails, experiences and error, and/or the like). Notably, in the case of integrated optical waveguide device 450, intensity curves of the periodic output optical signals are phase shifted as compared to those shown in FIG. 4B associated with integrated optical waveguide device 400 (e.g., due to port O2 of MMI 202 being coupled to port I3 of MMI 204 rather than port I2 of MMI 204).

The number and arrangement of optical elements shown and described in FIGS. 2A, 2C, 3A, 4A, and 4C are provided as examples. In practice, integrated optical waveguide device 200, integrated optical waveguide device 250, integrated optical waveguide device 300, integrated optical waveguide device 400, and/or integrated optical waveguide device 450 may include additional optical elements (e.g., an integrated laser), fewer optical elements (e.g., when PDs are not integrated), different optical elements, or differently arranged optical elements than those shown and described above. Additionally, or alternatively, a set of optical elements (e.g., one or more optical elements) of any of integrated optical waveguide device 200, integrated optical waveguide device 250, integrated optical waveguide device 300, integrated optical waveguide device 400, and/or integrated optical waveguide device 450 may perform one or more functions described as being performed by another set of elements of integrated optical waveguide device 200, integrated optical waveguide device 250, integrated optical waveguide device 300, integrated optical waveguide device 400, and/or integrated optical waveguide device 450, respectively. Further, the graphical representations shown in FIGS. 2B, 3B, 4B, and 4D are provided as examples for illustrative purposes, and other examples may be implemented.

Figure 5A:
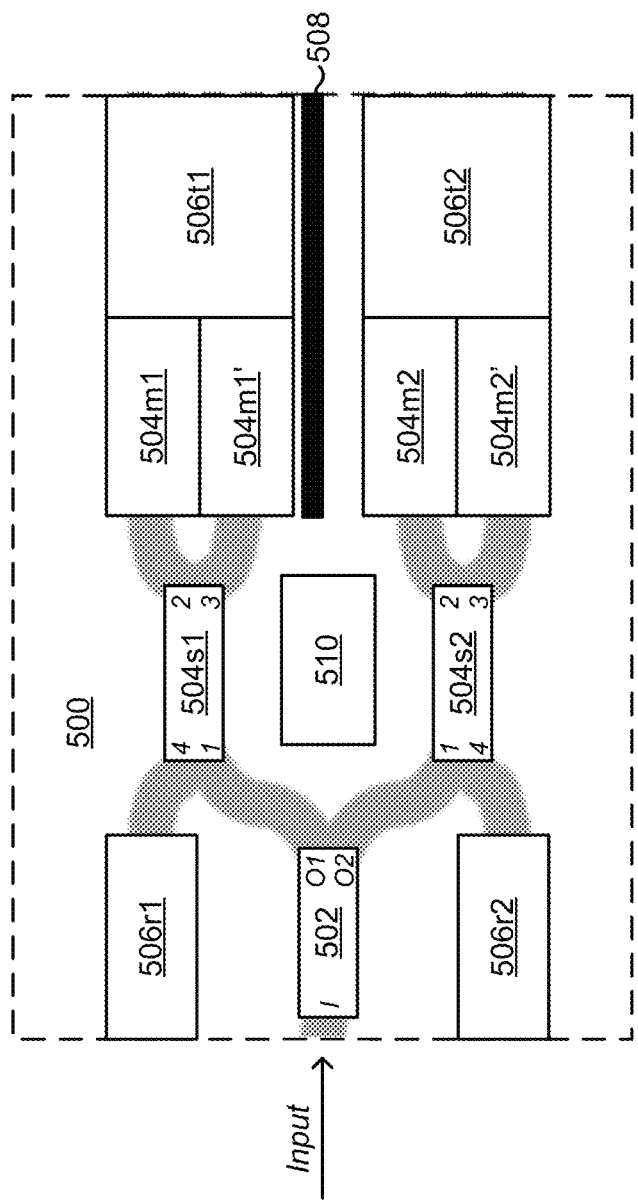
FIGS. 5A-5C are diagrams of example integrated optical waveguide devices including a waveguide splitter in the form of a 1×M (M≥2) waveguide splitter and M integrated periodic optical elements, each including a 2×2 waveguide coupler and a mirror structure.
Figure 5B:
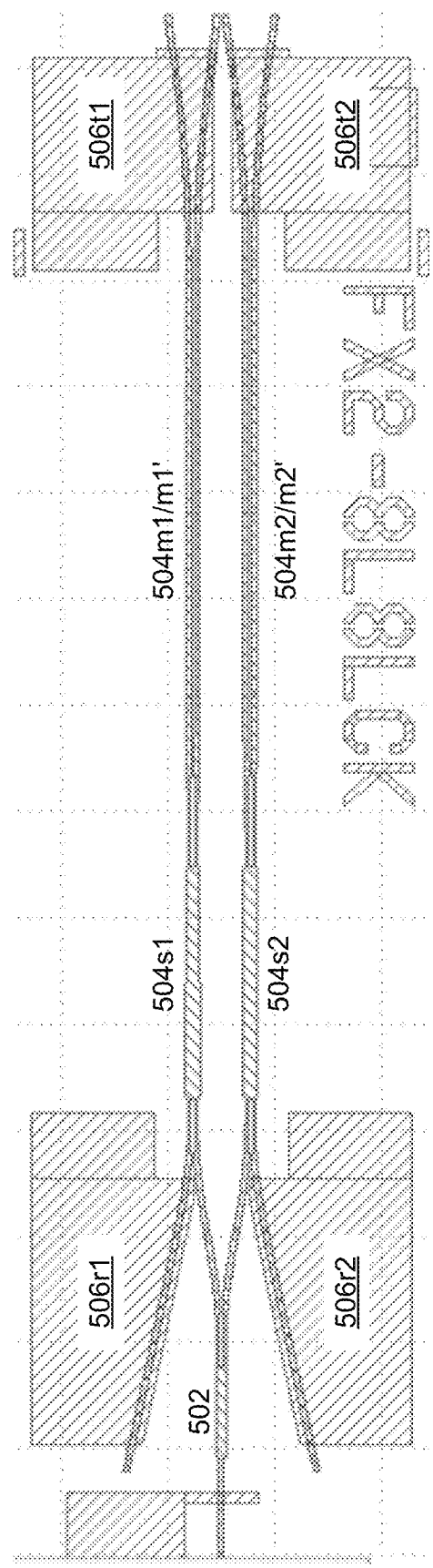
Figure 5C:
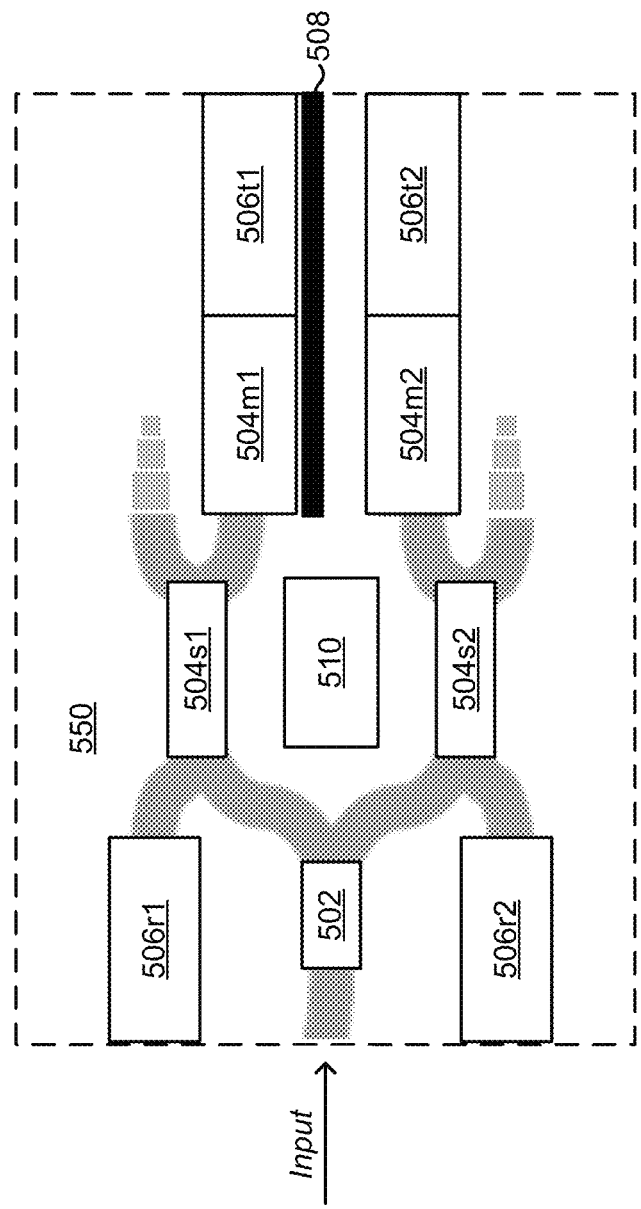

FIGS. 5A-5C are diagrams of example integrated optical waveguide devices including waveguide splitter 102 in the form of a 1×M (M≥2) waveguide splitter and M integrated periodic optical elements 104, each including a 2×2 waveguide coupler and a mirror structure. In the example implementations shown in FIGS. 5A-5C, waveguide splitter 502 corresponds to waveguide splitter 102. Additionally, each group of optical elements including a waveguide coupler 504*s* and an associated mirror structure 504*m* corresponds to one integrated periodic optical element 104. Further, each PD 506*r* and PD 506*t* pair corresponds to one pair of M pairs of PDs 106.

FIG. 5A is a diagram of an example implementation 500 of integrated optical waveguide device 100 (herein referred to as integrated optical waveguide device 500). In integrated optical waveguide device 500, each mirror structure 504*m* includes a pair of mirrors, as described below.

As shown in FIG. 5A, in integrated optical waveguide device 500, an input port I of waveguide splitter 502 (e.g., a 1×M waveguide splitter) is coupled to a waveguide via which an input optical signal can be received from an input source (e.g., a back side of laser 110).

As further shown, output port O1 of waveguide splitter 502 is coupled to port 1 of waveguide coupler 504*s*1 (e.g., a 2×2 waveguide coupler). As further shown, mirror 504*m*1 (i.e., a first mirror of a first mirror structure 504*m*) is coupled to port 2 of waveguide coupler 504*s*1, and mirror 504*m*1' (i.e., a second mirror of the first mirror structure 504*m*) is coupled to port 3 of waveguide coupler 504*s*1. As shown, in integrated optical waveguide device 500, mirrors 504*m*1 and 504*m*1' are coupled to PD 506*t*1. Finally, PD 506*r*1 is coupled to port 4 of waveguide coupler 504*s*1.

Similarly, output port O2 of waveguide splitter 502 is coupled to port 1 of waveguide coupler 504*s*2 (e.g., a 2×2 waveguide coupler). As further shown, mirror 504*m*2 (i.e., a first mirror of a second mirror structure 504*m*) is coupled to port 2 of waveguide coupler 504*s*2, and mirror 504*m*2' (i.e., a second mirror of the second mirror structure 504*m*) is coupled to port 3 of waveguide coupler 504*s*2. As shown, in integrated optical waveguide device 500, mirrors 504*m*2 and 504*m*2' are coupled to PD 506*t*2. Finally, PD 506*r*2 is coupled to port 4 of waveguide coupler 504*s*2.

In integrated optical waveguide device 500, two integrated periodic optical elements 104 are provided (e.g., such that two periodic output optical signals can be provided by integrated optical waveguide device 500). For example, as described above, each integrated periodic optical element 104 includes a waveguide coupler 504*s* and a mirror structure 504*m*. Thus, a first integrated periodic optical element 104 (i.e., a first wavelength reference) of integrated optical waveguide device 500 includes waveguide coupler 504*s*1, mirror 504*m*1, and mirror 504*m*1'. PD 504*t*1 (e.g., a PD arranged to receive light transmitted by mirrors 504*m*1 and 504*m*1') and PD 504*r*1 (e.g., a PD arranged to receive light reflected by mirrors 504*m*1 and 504*m*1') generate output electrical signals associated with the first integrated periodic optical element 104. Similarly, a second integrated periodic optical element 104 (i.e., a second wavelength reference) of integrated optical waveguide device 500 includes waveguide coupler 504*s*2, mirror 504*m*2, and mirror 504*m*2'. PD 504*t*2 (e.g., a PD arranged to receive light transmitted by mirrors 504*m*2 and 504*m*2') and PD 504*r*2 (e.g., a PD arranged to receive light reflected by mirrors 504*m*2 and 504*m*2') generate output electrical signals associated with the second integrated periodic optical element 104.

In integrated optical waveguide device 500, each integrated periodic optical element 104 is a guided-wave circulator with a periodic reflection spectrum. Reflection spectra of the two circulators are engineered to cover for each other's "dead" regions.

In operation, an input optical signal is received at port I of waveguide splitter 502, and is split into a first portion and a second portion at ports O1 and O2, respectively, of waveguide splitter 502. The first portion of the input optical signal propagates to port 1 of waveguide coupler 504*s*1. Waveguide coupler 504*s*1 directs the first portion of the input optical signal to mirrors 504*m*1 and 504*m*1' via port 2 and port 3 of waveguide coupler 504*s*1, which reflect the light back toward waveguide coupler 504*s*1. Here, light that is reflected by mirrors 504*m*1 and 504*m*1' is directed to PD 506*r*1 via port 4 of waveguide coupler 504*s*1. Any of the first portion of the input optical signal that is transmitted by mirror 504*m*1 or mirror 504*m*1' may be captured by PD 506*t*1. Conventional signal processing techniques can be applied to output electrical signals provided by PD 506*r*1 and PD 506*t*1 in order to yield both reflection and transmission of mirror 504*m*1 (equal to mirror 504*m*1') free from an effect of optical power noise.

Similarly, the second portion of the input optical signal propagates to port 1 of waveguide coupler 504*s*2. Waveguide coupler 504*s*2 directs the second portion of the input optical signal to mirrors 504*m*2 and 504*m*2' via port 2 and port 3 of waveguide coupler 504*s*2, which reflect the light back toward waveguide coupler 504*s*2. Here, light that is reflected by mirrors 504*m*2 and 504*m*2' is directed to PD 506*r*2 via port 4 of waveguide coupler 504*s*2. Any of the second portion of the input optical signal that is transmitted by mirror 504*m*2 or mirror 504*m*2' may be captured by PD 506*t*2. Conventional signal processing techniques can be applied to output electrical signals provided by PD 506*r*2 and PD 506*t*2 in order to yield both reflection and transmission of mirror 504*m*2 (equal to mirror 504*m*2 ') free from an effect of optical power noise.

In some implementations, mirrors (e.g., mirror 504*m*1, mirror 504*m*1', mirror 504*m*2, and/or mirror 504*m*2') in integrated optical waveguide device 500 may be lithographically identical or near-identical. Furthermore, in some implementations, mirrors of integrated optical waveguide device 500 may be arranged as close as possible to one another in order to reduce thermally induced asymmetry in their reflection spectra. In some implementations, a given mirror (e.g., mirror 504*m*1, mirror 504*m*1', mirror 504*m*2, or mirror 504*m*2') may be a guided-wave, 2-burst, sampled-grating, distributed Bragg reflector (SGDBR) with a periodic reflection spectrum. In some implementations, the 2-burst configuration of a mirror included in mirror structure 504*m* results in a reflection spectrum that is nearly sine-wave.

In some implementations, each integrated periodic optical element 104 of integrated optical waveguide device (e.g., each group of optical elements that includes a waveguide coupler 504*s* and an associated mirror structure 504*m*) may be lithographically identical or near-identical. However, reflection spectra of integrated periodic optical elements 104 of integrated optical waveguide device are offset relative to each other by, for example, approximately one-quarter of the FSR in order to allow coverage for "dead" regions, as described above.

In some implementations, the offset may be achieved using an offset heater 508 (e.g., a heater strip powered by an open-loop driver) that is asymmetrically placed, as shown in FIG. 5A. In some implementations, offset heater 508 may be controlled to asymmetrically heat a given mirror structure 504*m* in association with phase shifting a periodic output optical signal. For example, as shown in FIG. 5A, offset heater 508 may be placed in integrated optical waveguide device 500 such that offset heater 508 is nearer to a first mirror structure 504*m* (e.g., mirror structure 504*m* including mirror 504*m*1 and mirror 504*m*1') than to a second mirror structure 504*m* (e.g., mirror structure 504*m* including mirror 504*m*2 and mirror 504*m*2'). Here, offset heater 508, when applying heat, may asymmetrically heat the first mirror structure 504*m* and the second mirror structure 504*m* (e.g., such that comparatively more heat is applied to the first mirror structure 504*m* than the second mirror structure 504*m*). In this way, the phase difference between periodic output optical signals of integrated optical waveguide device 500 may be controlled.

Notably, when waveguide coupler 504*s* and mirror structure 504*m* within each integrated periodic optical element 104 are perfectly symmetrical, no reflection is produced at the input of integrated optical waveguide device 500. However, a departure from symmetry (e.g., caused by manufacturing defects or temperature non-uniformity) would result in some reflection at the input (e.g., reflection back to laser 110). However, the impact of this reflection on operation of laser 110 may be minimal since laser 110 typically includes a high-reflectance laser back mirror. In some implementations, the level of feedback can be reduced further by making a feed line between integrated optical waveguide device 500 and laser 110 operate as an attenuator. In some implementations, attenuation can be achieved by bending the feed line, including a tapered waveguide choke, or using another conventional technique.

In some implementations, as further shown in FIG. 5A, integrated optical waveguide device 500 may include temperature sensor 510 to measure a temperature of integrated optical waveguide device 500. In some implementations, temperature sensor 510 may be integrated on chip 108. In some implementations, as shown in FIG. 5A, temperature sensor 510 may be arranged in a central portion of integrated optical waveguide device 500 such that temperature sensor 510 is as close as possible to (e.g., between) mirror structures 504*m*.

As described above, each integrated periodic optical element 104 should be stable over a wide range of ambient temperatures. Given an approximate 0.1 nm/° C. tuning rate of a typical SGDBR mirror (dominated by a temperature-dependent refractive index of a semiconductor substrate), the temperature of integrated optical waveguide device 500 should be stable to better than approximately 0.08° C. in order to meet the frequency drift specification of 1 GHz. If accuracy of the temperature measurement is factored in, and an additional error budget is afforded for the laser locking loop, the temperature stability requirement tightens to 0.02° C.

In some implementations, temperature sensor 510 may include a forward-biased semiconductor junction, whose voltage under constant-current excitation is a measure of junction temperature. In order to measure the temperature to 0.02° C., temperature sensor 510 may be capable of measuring a junction voltage to better than approximately 30 microvolts (W), and may be capable of maintaining the junction current to better than approximately 0.3 microamps (µA). A worst-case combination of these errors guarantees frequency stability of approximately 0.5 GHz, leaving approximately 0.5 GHz for errors associated with the operation of the locking loop. Thus, a total error budget for frequency error of laser 110 would be approximately 1 GHz. In some implementations, temperature sensor 510 may include a thermistor-like sensing element that is fabricated on a surface of chip 108 (e.g., rather than a forward-biased semiconductor junction).

FIG. 5B is a schematic diagram of integrated optical waveguide device 500 when integrated on chip 108 (e.g., a semiconductor chip). In FIG. 5B, for purposes of clarity, only ridge and metal layers are shown. In some implementations, an overall length of integrated optical waveguide device 500 (e.g., as illustrated in FIG. 5B) may be in a range from approximately 0.1 mm to approximately 1.0 mm, such as 0.3 mm. In some implementations, a width (e.g., a channel width) of integrated optical waveguide device 500 (e.g., as illustrated in FIG. 5B) may be in a range from approximately 0.05 mm to approximately 0.5 mm, such as 0.2 mm.

FIG. 5C is a diagram of an example implementation 550 of integrated optical waveguide device 100 (herein referred to as integrated optical waveguide device 550). In integrated optical waveguide device 550, each mirror structure 504*m* includes a single mirror, as described below.

There is an element of risk in relying on symmetry of integrated periodic optical elements 104 as illustrated in integrated optical waveguide device 500 such that zero or near-zero reflection at the input is provided. Additionally, operation of offset heater 508 may lead to unwanted thermal asymmetry within each mirror structure 504*m* (e.g., since offset heater 508 is nearer to mirror 504*m*1 than mirror 504*m*1', and is nearer to mirror 504*m*2 than mirror 5204*m*2'). This situation can be avoided in integrated optical waveguide device 550 since each mirror structure 504*m* includes a single mirror (e.g., instead of a pair of mirrors). In the case of integrated optical waveguide device 550, circulator action is not provided. Rather, a reflector is implemented. Here, an equal amount of reflection is returned to port 1 and 4 of a given waveguide coupler 504s, which means a feed line should function as an attenuator (e.g., as described above).

In some implementations, attenuation should be provided in such a way as to minimize an amount of feedback seen by an input source (e.g., laser 110), while maintaining an appreciable signal level seen by PDs 506. When attenuation is provided in the feed line, light seen by PDs 506 is attenuated once, while light reflected back to the input is attenuated twice. As a result, a signal-to-feedback ratio increases with increasing attenuation—but this trend can be exploited only until the signal becomes sufficiently low such that noise at PDs 506 becomes a limiting factor.

In some implementations, the offset between integrated periodic optical elements 104 of integrated optical waveguide device 500 and integrated optical waveguide device 550 can be provided via lithography (e.g., rather than using offset heater 508 or in addition to using offset heater 508). Here, since the FSR of a 2-burst SGDBR mirror depends on a length of the 2-burst SGDBR mirror, slightly different mirror lengths can be built into a lithographic mask. This approach reduces complexity of integrated optical waveguide device 500/550 and driving electronics, but places a stricter burden on the manufacturing process. In some implementations, whether a heater-based solution or a lithographic solution is used may depend on tolerances of a given application.

In some implementations, integrated optical waveguide device 500 and/or integrated optical waveguide device 550 may include one or more additional integrated periodic optical elements 104. For example, integrated optical waveguide device 500 and integrated optical waveguide device 550 may include a third integrated periodic optical element 104 (e.g., a third wavelength reference) in order to provide additional or redundant coverage of "dead" regions in reflection spectra. As another example, integrated optical waveguide device 500 and/or integrated optical waveguide device 550 may include a third wavelength reference having a wide FSR (e.g., several thousand GHz) in order to operate as a slope-based wavelength discriminator for coarse wavelength tuning (e.g., while fine wavelength tuning and wavelength locking could be provided by the first and second wavelength references in the manner described above).

The number and arrangement of optical elements shown and described in FIGS. 5A and 5C are provided as examples. In practice, integrated optical waveguide device 500 and/or integrated optical waveguide device 550 may include additional optical elements (e.g., an integrated laser), fewer optical elements (e.g., when PDs are not integrated), different optical elements, or differently arranged optical elements than those shown and described above. Additionally, or alternatively, a set of optical elements (e.g., one or more optical elements) of integrated optical waveguide device 500 and/or integrated optical waveguide device 550 may perform one or more functions described as being performed by another set of elements of integrated optical waveguide device 500 and/or integrated optical waveguide device 550, respectively. Further, the schematic diagram shown in FIG. 5B is provided as an example for illustrative purposes, and other examples are possible.

Some implementations described herein provide an integrated optical waveguide device 100 that provides, based on an input optical signal, a plurality of periodic output optical signals, each of which is phase shifted with respect to other periodic output optical signals of the plurality of periodic output optical signals. In some implementations, integrated optical waveguide device 100 can include optical waveguide splitter 102 and a plurality of integrated periodic optical elements 104 that provide the plurality of periodic output optical signals. The plurality of periodic output optical signals can be used in association with, for example, wavelength locking laser 110. As described above, integrated optical waveguide device 100 solves several issues suffered by conventional wavelength lockers (e.g., single etalon wavelength lockers, dual etalon wavelength lockers, and wavelength lockers including a conventional DLI).

The foregoing disclosure provides illustration and description, but is not intended to be exhaustive or to limit the implementations to the precise forms disclosed. Modifications and variations may be made in light of the above disclosure or may be acquired from practice of the implementations. For example, while the implementations described herein are described largely in the context of integrated wavelength lockers, these implementations can be applied to a coherent receiver in which coherent (phase shift keyed or phase and amplitude keyed) signal light is mixed with a local oscillator in an N×N MMI mixer in order to generate N sine waves that are equally spaced in phase (e.g., in a similar manner similar to that illustrated in FIGS. 2B, 3B, 4B, and 4D). This would allow, for example, a constellation diagram to be determined from, for example, four pairs of differential detector signals (e.g., using an 8×8 MMI coupler).

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An on-chip wavelength locker, comprising:
   an optical waveguide splitter configured to split an input optical signal received from a laser,
      wherein the optical waveguide splitter includes a 1×M multimode interference (MMI) coupler, and
      wherein M≥2;
   a plurality of integrated periodic optical elements including an N×N MMI coupler,
      wherein N is equal to 3, equal to 5, or greater than 5, and
      wherein each integrated periodic optical element, of the plurality of integrated periodic optical elements, is configured to:
         receive a respective portion of the input optical signal after splitting of the input optical signal by the optical waveguide splitter, and provide, based on the respective portion of the input optical signal, a respective periodic output optical signal of a plurality of periodic output optical signals, wherein each periodic output optical signal, of the plurality of periodic output optical signals, is phase shifted with respect to other periodic output optical signals of the plurality of periodic output optical signals, wherein an input to each input port of the N×N MMI coupler is divided equally to each output port of the N×N MMI coupler, wherein a first output port of the 1×M MMI coupler is coupled to a first input port of the N×N MMI coupler, and wherein a second output port of the 1×M MMI coupler is coupled to a second input port of the N×N MMI coupler that is not a symmetrically equivalent port of the first input port of the N×N MMI coupler; and a plurality of integrated photodiodes configured to receive the plurality of periodic output optical signals in association with wavelength locking the laser.

2. The on-chip wavelength locker of claim 1, wherein the input optical signal is received from a back side of the laser.

3. The on-chip wavelength locker of claim 1, wherein the on-chip wavelength locker and the laser are integrated on a single chip.

4. The on-chip wavelength locker of claim 1, wherein the 1×M MMI coupler is a 1×2 MMI coupler, and the plurality of integrated photodiodes includes N photodiodes.

5. The on-chip wavelength locker of claim 4, wherein the first output port of the 1×2 MMI coupler is coupled to the first input port of the N×N MMI coupler via a first waveguide, and the second output port of the 1×2 MMI coupler is coupled to the second input port of the N×N MMI coupler via a second waveguide, and wherein a length of the second waveguide is greater than a length of the first waveguide.

6. The on-chip wavelength locker of claim 1, wherein the plurality of integrated periodic optical elements includes M integrated periodic optical elements, and the plurality of integrated photodiodes includes M pairs of integrated photodiodes, wherein one of the M integrated periodic optical elements includes a 2×2 waveguide coupler and a mirror structure, and wherein one of the M pairs of integrated photodiodes includes a reflection-sensing photodiode and a transmission-sensing photodiode.

7. The on-chip wavelength locker of claim 6, wherein the mirror structure includes at least one 2-burst, sampled grating, distributed Bragg reflector (SGDBR) mirror.

8. The on-chip wavelength locker of claim 6, further comprising an offset heater configured to asymmetrically heat the mirror structure in association with phase shifting a periodic output optical signal of the plurality of periodic output optical signals.

9. The on-chip wavelength locker of claim 6, further comprising a temperature sensor configured to measure a temperature of the on-chip wavelength locker.

10. The on-chip wavelength locker of claim 6, wherein the mirror structure includes a first mirror and a second mirror, each coupled to the transmission-sensing photodiode, wherein an output port of the 1×M MMI coupler is coupled to a first port of the 2×2 waveguide coupler, wherein the first mirror is coupled to a second port of the 2×2 waveguide coupler, wherein the second mirror is coupled to a third port of the 2×2 waveguide coupler, and wherein the reflection-sensing photodiode is coupled to a fourth port of the 2×2 waveguide coupler.

11. The on-chip wavelength locker of claim 6, wherein the mirror structure includes a mirror coupled to the transmission-sensing photodiode, wherein an output port of the 1×M MMI coupler is coupled to a first port of the 2×2 waveguide coupler, wherein the mirror is coupled to a second port of the 2×2 waveguide coupler, and wherein the reflection-sensing photodiode is coupled to a third port of the 2×2 waveguide coupler.

12. The on-chip wavelength locker of claim 6, wherein the mirror structure is configured to introduce a phase shift in a particular periodic output optical signal of the plurality of periodic output optical signals.

13. An integrated optical waveguide device, comprising:
an optical waveguide splitter configured to split an input optical signal,
wherein the optical waveguide splitter includes a 1×M multimode interference (MMI) coupler, and
wherein M≥2; and a plurality of integrated periodic optical elements including an N×N MIMI coupler,
wherein N is equal to 3, equal to 5, or greater than 5, and
wherein each integrated periodic optical element, of the plurality of integrated Periodic optical elements, is configured to:
receive a respective portion of the input optical signal after splitting of the input optical signal by the optical waveguide splitter, and
provide, based on the respective portion of the input optical signal, a respective periodic output optical signal of a plurality of periodic output optical signals,
wherein each periodic output optical signal, of the plurality of periodic output optical signals, is phase shifted with respect to other periodic output optical signals of the plurality of periodic output optical signals,
wherein an input to each input port of the N×N MMI coupler is divided equally to each output port of the N×N MMI coupler,
wherein a first output port of the 1×M MMI coupler is coupled to a first input port of the N×N MMI coupler, and
wherein a second output port of the 1×M MMI coupler is coupled to a second input port of the N×N MMI coupler that is not a symmetrically equivalent port of the first input port of the N×N MMI coupler.

14. The integrated optical waveguide device of claim 13, wherein the plurality of integrated periodic optical elements includes M integrated periodic optical elements,
wherein one of the M integrated periodic optical elements includes a 2×2 waveguide coupler and a mirror structure.

15. The integrated optical waveguide device of claim 13, wherein the integrated optical waveguide device is included in a wavelength locker.

16. The integrated optical waveguide device of claim 13, wherein the integrated optical waveguide device is included in a coherent receiver.

17. An integrated optical device, comprising:
an optical waveguide splitter to split an input optical signal,
   wherein the optical waveguide splitter includes a 1×M multimode interference (MMI) coupler, and
   wherein M≥2;
a plurality of integrated periodic optical elements including an N×N MIMI coupler,
   wherein N is equal to 3, equal to 5, or greater than 5,
   wherein each integrated periodic optical element, of the plurality of integrated periodic optical elements, is configured to:
      receive a respective portion of the input optical signal after splitting of the input optical signal by the optical waveguide splitter, and
      provide, based on the respective portion of the input optical signal, a respective periodic output optical signal of a plurality of periodic output optical signals,
         wherein each periodic output optical signal, of the plurality of periodic output optical signals, is phase shifted with respect to other periodic output optical signals of the plurality of periodic output optical signals,
         wherein an input to each input port of the N×N MMI coupler is divided equally to each output port of the N×N MMI coupler,
         wherein a first output port of the 1×M MMI coupler is coupled to a first input port of the N×N MMI coupler, and
         wherein a second output port of the 1×M MMI coupler is coupled to a second input port of the N×N MMI coupler that is not a symmetrically equivalent port of the first input port of the N×N MMI coupler; and
a plurality of photodiodes to receive the plurality of periodic output optical signals, wherein one of:
   the plurality of photodiodes includes N photodiodes, or
   the plurality of integrated periodic optical elements includes M integrated periodic optical elements, and the plurality of photodiodes includes M pairs of photodiodes,
      wherein one of the M integrated periodic optical elements includes a 2×2 waveguide coupler and a mirror structure, and
      wherein one of the M pairs of photodiodes includes a reflection-sensing photodiode and a transmission-sensing photodiode.

18. The on-chip wavelength locker of claim 6, wherein the 2×2 waveguide coupler is a first 2×2 waveguide coupler and the mirror structure is a first mirror structure,
   wherein another one of the M integrated periodic optical elements includes a second 2×2 waveguide coupler and a second mirror structure, and
   wherein a heater is disposed nearer to the first mirror structure than the second mirror structure.

19. The on-chip wavelength locker of claim 6, wherein the mirror structure includes a first mirror and a second mirror, and
   wherein a heater is disposed nearer to the first mirror than the second mirror.

20. The integrated optical waveguide device of claim 14, wherein the 2×2 waveguide coupler is a first 2×2 waveguide coupler and the mirror structure is a first mirror structure,
   wherein another one of the M integrated periodic optical elements includes a second 2×2 waveguide coupler and a second mirror structure, and
   wherein a heater is disposed nearer to the first mirror structure than the second mirror structure.

* * * * *